United States Patent
Rubinsztain et al.

(10) Patent No.: US 11,561,257 B2
(45) Date of Patent: Jan. 24, 2023

(54) SIGNAL PATH MONITOR

(71) Applicant: Allegro MicroSystems, LLC, Manchester, NH (US)

(72) Inventors: Ezequiel Rubinsztain, Buenos Aires (AR); Pablo Javier Bolsinger, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 205 days.

(21) Appl. No.: 17/130,161

(22) Filed: Dec. 22, 2020

(65) Prior Publication Data

US 2022/0196739 A1 Jun. 23, 2022

(51) Int. Cl.
*G01R 31/3185* (2006.01)
*G01R 31/319* (2006.01)
*G01R 31/316* (2006.01)
*G01R 31/3167* (2006.01)
*G01R 31/3163* (2006.01)

(52) U.S. Cl.
CPC ....... *G01R 31/316* (2013.01); *G01R 31/3163* (2013.01); *G01R 31/3167* (2013.01); *G01R 31/31926* (2013.01); *G01R 31/318566* (2013.01); *G01R 31/318569* (2013.01)

(58) Field of Classification Search
None
See application file for complete search history.

(56) References Cited

U.S. PATENT DOCUMENTS

| | | | |
|---|---|---|---|
| 6,815,944 B2 | 11/2004 | Vig et al. | |
| 7,026,808 B2 | 4/2006 | Vig et al. | |
| 7,323,870 B2 | 1/2008 | Tatschl et al. | |
| 7,694,200 B2 | 4/2010 | Forrest et al. | |
| 7,800,389 B2 | 9/2010 | Friedrich et al. | |
| 7,923,996 B2 | 4/2011 | Doogue et al. | |
| 8,030,918 B2 | 10/2011 | Doogue et al. | |
| 8,084,969 B2 | 12/2011 | David et al. | |
| 8,447,556 B2 | 5/2013 | Friedrich et al. | |
| 8,542,010 B2 | 9/2013 | Cesaretti et al. | |
| 8,680,846 B2 | 3/2014 | Cesaretti et al. | |
| 8,692,546 B2 | 4/2014 | Cesaretti et al. | |
| 8,754,640 B2 | 6/2014 | Vig et al. | |
| 8,818,749 B2 | 8/2014 | Friedrich et al. | |
| 8,860,404 B2 | 10/2014 | Dwyer et al. | |
| 8,890,518 B2 | 11/2014 | Daubert | |
| 8,937,797 B2 | 1/2015 | Pirchio et al. | |
| 9,151,807 B2 | 10/2015 | Friedrich et al. | |
| 9,164,826 B2 | 10/2015 | Fernandez | |

(Continued)

OTHER PUBLICATIONS

U.S. Appl. No. 16/788,505, filed Feb. 12, 2020, Scheller et al.

(Continued)

*Primary Examiner* — Jermele M Hollington
(74) *Attorney, Agent, or Firm* — Daly, Crowley, Mofford & Durkee, LLP (57) ABSTRACT

A method for testing a signal path in a sensor, the signal path including a filter circuit and a comparator circuit, the method including: closing a first signal line that is arranged to bypass a first capacitor in the filter circuit; injecting a test signal into the signal path after the first signal line is closed; and detecting whether a signal that is output by the comparator circuit in response to the test signal satisfies a predetermined condition.

20 Claims, 7 Drawing Sheets

(56) References Cited

U.S. PATENT DOCUMENTS

| | | |
|---|---|---|
| 9,201,122 B2 | 12/2015 | Cesaretti et al. |
| 9,222,990 B2 | 12/2015 | Dwyer et al. |
| 9,383,425 B2 | 7/2016 | Milano et al. |
| 9,645,220 B2 | 5/2017 | Cesaretti et al. |
| 9,817,078 B2 | 11/2017 | Pepka et al. |
| 9,910,088 B2 | 3/2018 | Milano et al. |
| 10,001,519 B2 | 6/2018 | Choe et al. |
| 10,380,879 B2 | 8/2019 | Haas |
| 10,551,439 B2 | 2/2020 | Drouin |
| 10,580,289 B2 | 3/2020 | Haas et al. |
| 10,613,158 B2 | 4/2020 | Cook |
| 10,641,802 B2 | 5/2020 | Petrie |
| 10,692,362 B2 | 6/2020 | Petrie et al. |
| 10,746,814 B2 | 8/2020 | Rubinsztain et al. |
| 10,873,320 B2 | 12/2020 | Procházka |
| 10,921,373 B2 | 2/2021 | Lassalle-Balier |
| 10,948,537 B2 | 3/2021 | Forrest et al. |
| 11,194,004 B2 * | 12/2021 | Scheller ............ G01R 35/00 |
| 2010/0237890 A1 | 9/2010 | Motz et al. |
| 2010/0308879 A1 | 12/2010 | Ishizaki |
| 2011/0221518 A1 | 9/2011 | Romero |
| 2013/0335066 A1 | 12/2013 | Cesaretti et al. |
| 2014/0266181 A1 | 9/2014 | Milano et al. |
| 2015/0185284 A1 | 7/2015 | Milano et al. |
| 2015/0185293 A1 | 7/2015 | Milano et al. |
| 2016/0139199 A1 | 5/2016 | Petrie et al. |
| 2017/0016965 A1 | 1/2017 | Chaware et al. |
| 2017/0176566 A1 | 6/2017 | Monreal et al. |
| 2018/0011150 A1 | 1/2018 | Pepka et al. |
| 2018/0017616 A1 | 1/2018 | Petrie et al. |
| 2018/0136999 A1 | 5/2018 | Fernandez |
| 2019/0257909 A1 | 8/2019 | Romero |
| 2019/0369183 A1 * | 12/2019 | Wang ............ G01R 33/3628 |
| 2019/0391212 A1 * | 12/2019 | Rubinsztain ....... G01R 33/0029 |
| 2020/0049760 A1 | 2/2020 | Milano et al. |
| 2020/0249264 A1 | 8/2020 | Briano |
| 2021/0247478 A1 * | 8/2021 | Scheller ............ G01D 5/142 |

OTHER PUBLICATIONS

Office Action dated Mar. 17, 2020 for U.S. Appl. No. 16/014,075; 14 pages.
Response to Office Action dated filed on Jun. 15, 2020 for U.S. Appl. No. 16/014,075; 11 pages.
Notice of Allowance dated Jun. 25, 2020 for U.S. Appl. No. 16/014,075; 7 pages.
Response to Office Action filed Dec. 19, 2019 for European Application No. 19177769.7; 3 pages.
Extended European Search Report dated Feb. 26, 2020 for European Application No. 19177769.7; 8 pages.
Examination Report dated Feb. 15, 2022 for European Application No. 19177769.7, 5 pages.
Response to Examination Report dated Feb. 15, 2022 filed on Aug. 18, 2022 for European Application No. 19177769.7, 47 pages.

* cited by examiner

SIGNAL PATH MONITOR

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety critical applications. There are a variety of specifications that set forth requirements related to permissible sensor quality levels, failure rates, and overall functional safety.

SUMMARY

According to aspects of the disclosure, a method for testing a signal path in a sensor, the signal path including a filter circuit and a comparator circuit, the method comprising: closing a first signal line that is arranged to bypass a first capacitor in the filter circuit; injecting a test signal into the signal path after the first signal line is closed; and detecting whether a signal that is output by the comparator circuit in response to the test signal satisfies a predetermined condition.

According to aspects of the disclosure, a system is provided, comprising: a signal processor; one or more sensing elements; a signal path that is arranged to couple the one or more sensing elements to the signal processor, the signal path including a comparator circuit and a filter circuit, the filter circuit including a first capacitor; and a diagnostic circuit configured to: close a first signal line that is arranged to bypass the first capacitor in the filter circuit, inject a test signal in the signal path after the first signal line is closed, and detect whether a signal that is output by the comparator circuit in response to the test signal satisfies a predetermined condition.

According to aspects of the disclosure, a system is provided, comprising: a signal processor; one or more sensing elements; a signal path that is arranged to couple the one or more sensing elements to the signal processor, the signal path including a comparator circuit and a filter circuit, the filter circuit including a capacitor; and a diagnostic circuit configured to: close a first signal line that is arranged to bypass a capacitor in the filter circuit, inject a test signal in the signal path after the first signal line is closed, and detect whether a signal that is output by any component of the signal path, in response to the test signal, satisfies a respective predetermined condition.

BRIEF DESCRIPTION OF THE DRAWINGS

The foregoing features may be more fully understood from the following description of the drawings in which.

DETAILED DESCRIPTION

Figure 1A:
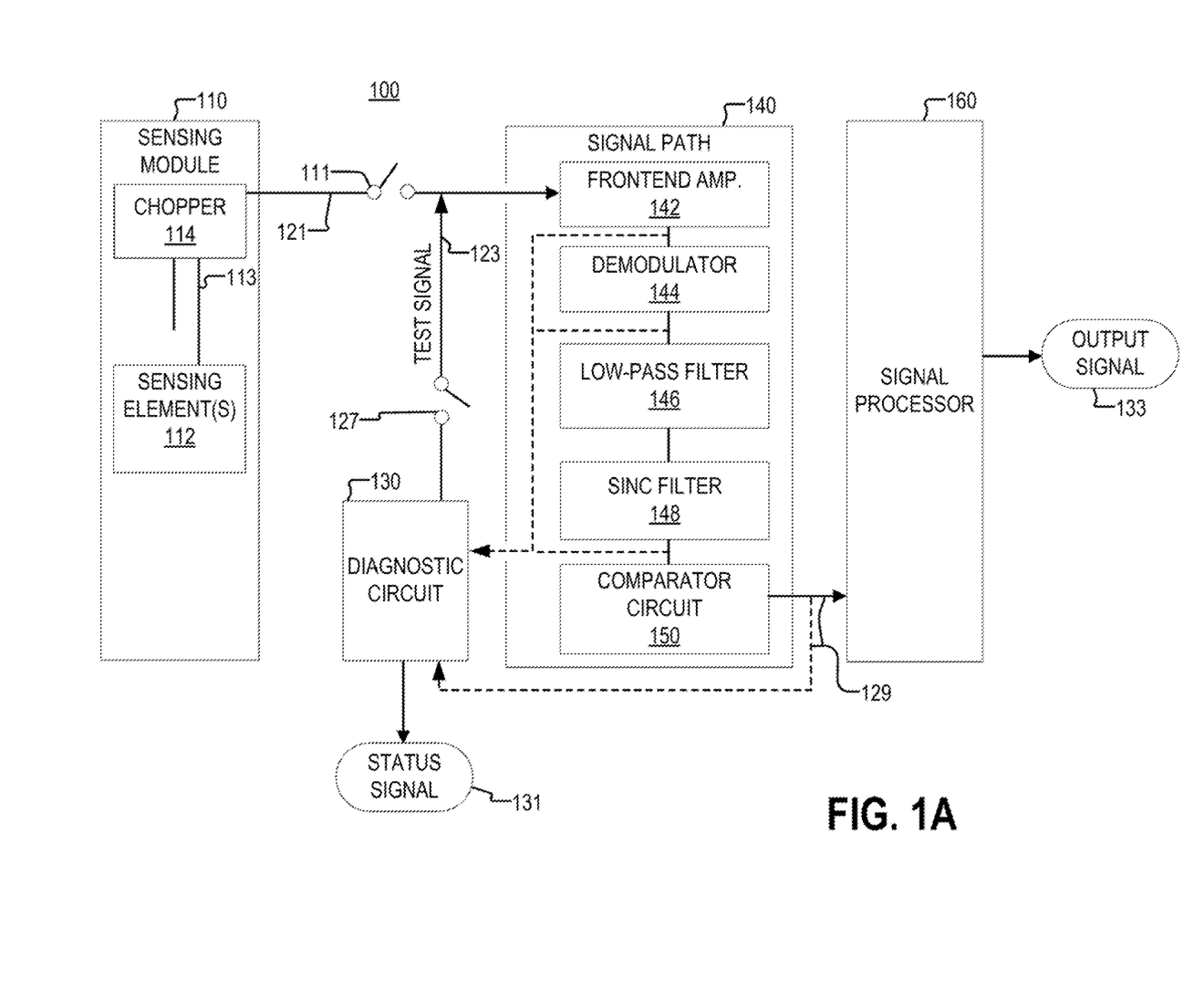
FIG. 1A is a diagram of an example of a sensor system, according to aspects of the disclosure.

FIG. 1A is a diagram of an example of a sensor system 100, according to aspects of the disclosure. The sensor system 100 may include a sensing module 110, a diagnostic circuit 130, a signal path 140, and a signal processor 160. In some implementations, the sensor system 100 can take the form of an integrated circuit that is formed on a substrate, and the substrate can include one or more semiconductor substrates.

The sensing module 110 may include one or more sensing elements 112 and a chopper 114. The sensing elements 112 may be arranged to form a bridge circuit and/or in any other suitable type of circuit. The chopper 114 may modulate a signal 113 that is generated by the sensing elements 112 to produce a signal 121. As is well-known in the art, the modulation of the signal 407 may be performed for the purposes of removing the offset of the sensing module 110, and the signal 121 may have at least one of a first phase and a second phase.

Any of the sensing elements 112 can include one or more magnetic field sensing elements, such as Hall effect elements, magnetoresistance elements, or magnetotransistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

According to the example of FIG. 1A, each of the sensing elements 112 is a Hall effect element. However, it will be understood that the present disclosure is not limited to any specific type of magnetic field sensing element being part of the sensing module 110. Furthermore, although in the example of FIG. 1A each of the sensing elements 112 is a magnetic field sensing element, it will be understood that alternative implementations are possible in which any of the sensing elements 112 is another type of sensing element, such as a light-sensing element, a pressure sensing element, a temperature sensing element, etc.

The signal path 140 may process the signal 121 to produce a signal 129, which is subsequently provided to the signal processor 160 and the diagnostic circuit 130. As is discussed further below, processing the signal 121 may include amplifying the signal 121 with a frontend amplifier 142, demodulating the amplified signal with a demodulator 144, filtering the demodulated signal with a low-pass filter 146 and a sine filter 148, and using a comparator circuit 150 to compare the filtered signal to a predetermined threshold. The operation of the signal path 140 is discussed further below with respect to FIG. 2. Although in the example of FIG. 1, the sensor system 100 includes a single-stage amplification, alternative implementations are possible in which the sensor system 100 includes two-stage amplification. In such implementations, an additional amplifier may be disposed between the low-pass filter 146 and the sine filter 148. The signal processor 160 may process the signal 129 to produce an output signal 133. According to the example of FIG. 1A, the output signal 133 indicates the magnetic flux density of a magnetic field that is incident on the sensor system 100. As non-limiting examples depending on the sensor application, the output signal 133 can indicate a proximity and/or motion of a target object (e.g. speed, direction and/or angle) or current through a conductor. However, alternative implementations are possible in which the output signal 133 indicates the value of another quantity, such as temperature, humidity, pressure, light intensity, light color, etc. In some implementations, the output signal 133 may be generated by adjusting the gain and/or offset of the signal 129 in a well-known fashion. By way of example, the gain and/or offset of the signal 129 may be adjusted based on a signal provided by a temperature sensor, a stress sensor, or a humidity sensor. It will be understood that the present disclosure is not limited to any specific technique for adjusting the gain and/or offset of the signal 129.

The diagnostic circuit 130 may be configured to inject a test signal 123 into the signal path 140 to test whether the signal path 140 is operating correctly. From any of the elements in the signal path 140, the diagnostic circuit 130 may receive a feedback signal (denoted by the dashed lines in FIG. 1A) that is output from that element in response to the test signal 123. The diagnostic circuit 130 may compare the received signal to a threshold and output a status signal 131 based on the outcome of the comparison. For example, if the received signal is above the threshold, the diagnostic circuit 130 may set the status signal 131 to a first value that indicates that the signal path 140 is operating correctly. On the other hand, if the received signal is below the threshold, the diagnostic circuit 130 may set the status signal 131 to a second value indicating a failure in the signal path 140. In some respects, integrating the diagnostic circuit 130 into the sensor system 100 is advantageous because it can increase the dependability of the sensor system 100 and render it compliant with various safety standards, such as the Automotive Safety Integrity Level (ISO265262) standard.

In some implementations, components that are not tested with the diagnostic circuit 130 (and/or other components) may be duplicated to increase the reliability of the sensor system 100. For example, any of the low-pass filter 146, the sampling capacitor 212A, and the sampling capacitor 212B may be duplicated. In such implementations, resistors can be arranged as sum of parallel units that any short or open between redundant elements does not change significantly the value of the signal that is produced by the redundant elements.

As discussed further below with respect to FIG. 2, the DC component 164 of the signal 121 may be removed by demodulating the signal 121 with the demodulator 144 and running the demodulated signal through the low-pass filter 146. Afterwards, the output of the low-pass filter 146 may be run through the sinc filter 148 to smooth short-term fluctuations of the filtered signal. The output of the sinc filter 148 may be digitized by using a Schmitt trigger circuit 228 (shown in FIG. 2), which is part of the comparator circuit 150, and provided to the signal processor 160, where it is used as a basis for generating the output signal 133.

Figure 2:
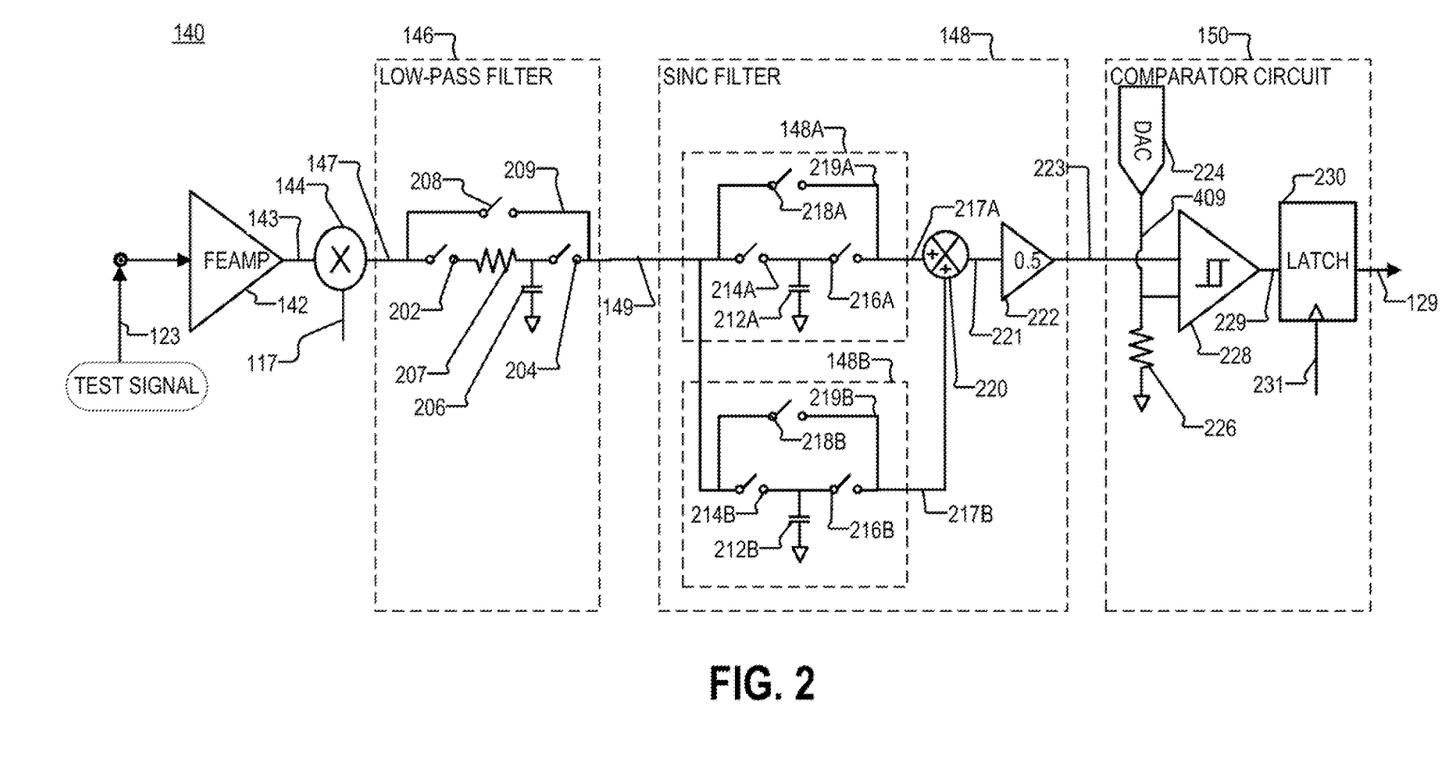
FIG. 2 is a diagram of an example of a signal path that is part of the sensor system of FIG. 1A, according to aspects of the disclosure.

FIG. 2 shows the signal path 140 in accordance with one particular implementation. The signal path 140 may include the frontend amplifier 142, the demodulator 144, the low-pass filter 146, the sinc filter 148, and the comparator circuit 150.

The low-pass filter 146 may include a switch 202, a switch 204, a capacitor 206, a resistor 207, and a switch 208. The switches 202 and 204 may be configured to connect and disconnect the capacitor 206 from the rest of the signal path 140 and the switch 208 may be configured to open and close a bypass line 209 around the capacitor 206.

The sinc filter 148 may include a first portion 148A and a second portion 148B, an addition unit 220, and a division unit 222. The first portion 148A may include a sampling capacitor 212A, a switch 214A, a switch 216A, and a switch 218A. The switches 214A and 216A may be configured to connect and disconnect the sampling capacitor 212A from the rest of the signal path 140. The switch 218A may be configured to open and close a bypass line 219A around the sampling capacitor 212A. The second portion 148B may include a sampling capacitor 212B, a switch 214B, a switch 216B, and a switch 218B. The switches 214B and 216B may be configured to connect and disconnect the capacitor sampling capacitor 212B from the rest of the signal path 140. The switch 218B may be configured to open and close a bypass line 219B around the capacitor 212B. The addition unit 220 and the division unit 222 may be configured to calculate the average of the samples that are stored in the sampling capacitors 212A and 212B, respectively and provide the calculated average to the comparator circuit 150.

The comparator circuit 150 may include a current digital-to-analog converter (DAC) 224, a resistor 226, a Schmitt trigger circuit 228, and a latch 230. The DAC 224, together with the resistor 226, may be configured to supply a (voltage) threshold signal 409 to the Schmitt trigger circuit 228. The terms "signal 409" and "threshold 409 of the Schmitt trigger circuit 228" are used interchangeably throughout the disclosure. The value of the threshold 409 may change according to the state of a signal that is output from the Schmitt trigger circuit 228 (e.g., signal 229). As is discussed further below, the threshold 409 may vary between a value Brp (i.e., a release point of the Schmitt trigger circuit 228) and a value Bop (i.e., an operate point of the Schmitt trigger circuit 228). The difference between Bop and Brp is the hysteresis of the Schmitt trigger circuit 228. The built-in hysteresis of the Schmitt trigger circuit allows clean switching even in the presence of external mechanical vibration and electrical noise.

More particularly, the Schmitt trigger circuit 228 may include a comparator circuit with hysteresis. In operation, the Schmitt trigger may compare the value of a signal (e.g., signal 223) that is input into the Schmitt trigger circuit 228 to the threshold 409. The Schmitt trigger circuit 228 may set its output to a logic-high value when the value of the signal (e.g., signal 223) that is input into the Schmitt trigger exceeds the threshold 409. The Schmitt trigger circuit 228 may hold the logic-high output until the value of the signal that is input into the Schmitt trigger circuit falls below the threshold 409.

When the Schmitt trigger circuit 228 experiences a failure, its operate point and/or release point can change causing the sensor system 100 to operate incorrectly. As is discussed further below with respect to FIG. 5, the diagnostic circuit 130 may be used to detect such failures and take appropriate action in response. An example of a scenario in which a failure in the Schmitt trigger circuit 228 causes the release point of the Schmitt trigger circuit 228 to change is discussed further below with respect to FIG. 5.

Although in the example of FIGS. 1A-2 the comparator circuit 150 includes a Schmitt trigger circuit, the present disclosure is not limited thereto. It should be understood that a so-called comparator circuit can be comprised of an analog comparator having a two state output signal indicative of an input signal being above or below a threshold level (or indicative of one input signal being above or below another input signal). However, the comparator circuit can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

Figure 7:
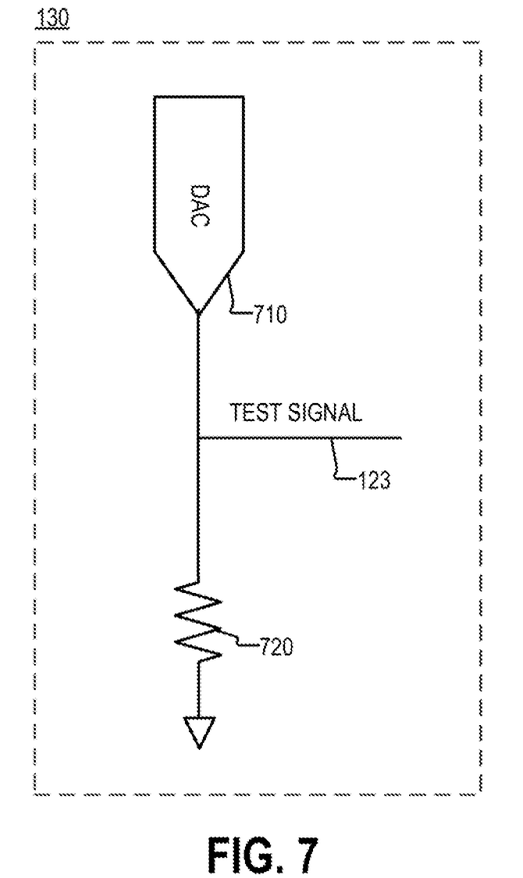
FIG. 7 is a diagram of an example of a diagnostic circuit, according to aspects of the disclosure.

In some implementations, the diagnostic circuit 130 may be include a current digital-to-analog converter (DAC) 710 that is coupled in series with an adjustable diagnostic resistor 720 (e.g., see FIG. 7). In some implementations, the test signal 123 may be a replica of the signal 409 divided by the gain of the amplifier 142. Additionally or alternatively, in some implementations, the test signal 123 can be set at a percentage higher or lower than the value Bop by either changing the value of the resistor 720 or the DAC 720. In this way the diagnostic circuit 130 (and/or the signal processor 160) can evaluate if the Schmitt trigger circuit 228 responds correctly for a given value of the test signal 123. In some implementations, the diagnostic circuit 130 can be used to determine whether the value of the operate point of the Schmitt trigger circuit 228 is within 15% of its expected range. For example, the test signal 123 may be set to a value that is 15% higher than Bop and the signal 409 can be forced to its low value (which would be Bop if the Schmitt trigger circuit 228 and/or sinc filter 148 are operating correctly). If the Schmitt trigger circuit 228 responds correctly, this would indicate that the sinc filter 148 and the Schmitt trigger circuit 228 are generating an operate point for the Schmitt trigger circuit 228 that exceeds, by more than 15%, the expected value of the operate point (i.e., the value Bop) of the Schmitt trigger circuit 228. As another example, the test signal 123 may be set to a value that is 15% lower than Bop and the signal 409 can be forced to its low value (which would be Bop if the Schmitt trigger circuit 228 and/or sinc filter 148 are operating correctly). If the Schmitt trigger circuit 228 responds correctly, this would indicate that the sinc filter 148 and the Schmitt trigger circuit 228 are generating an operate point for the Schmitt trigger circuit 228 that falls short, by more than 15%, of the expected value of the operate point (i.e., the value Bop)

Figure 3:
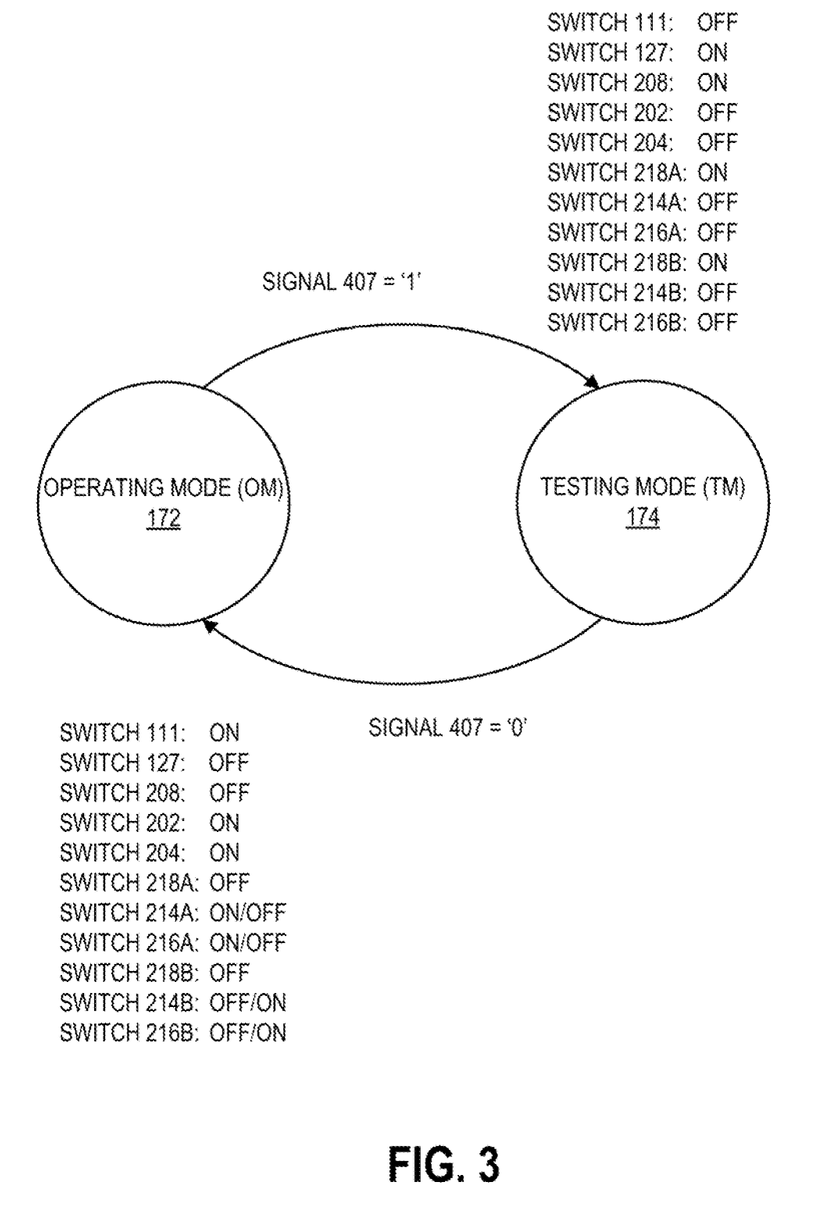
FIG. 3 is a state diagram illustrating the operation of the sensor system of FIG. 1A, according to aspects of the disclosure.

FIG. 3 is a state diagram illustrating one aspect of the operation of the sensor system 100. As illustrated, at any time during its operation, the sensor system 100 can be in one of an operating mode 172 and testing mode 174.

When the sensor system 100 is in operating mode 172, the sensor system 100 uses the sensing module 110 to measure a magnetic field (or another quantity) and generates the output signal 133 based on the measured magnetic field (or other quantity). When the sensor system 100 is in the operating mode 172: switch 111 is turned on, switch 127 is turned off, switch 208 is turned off, switch 202 is turned on, switch 204 is turned on, switch 218A is turned off, and switch 218B is turned off. Furthermore, when the sensor system 100 is in the operating mode 172, one of the switches 214A-216A and 214B-216B is also turned on. For example, when the sensor system 100 enters the operating mode 172, switches 214A and 216A may be turned on, and switches 214B and 216B may be turned off, allowing the signal that is input into the sinc filter 148 (e.g., signal 149) to be sampled by the sampling capacitor 212A. Next time the sensor system 100 enters the operating mode 172, the switches 214A and 216A may be turned off, and the switches 214B and 216B may be turned on, allowing the signal that is input into the sinc filter 148 (e.g., signal 149) to be sampled by the sampling capacitor 212B. In other words, the switches 214A, 216A, 214B, and 216B may be operated in such a way, so as to allow the sinc filter 148 to alternate between sampling its input signal into the sampling capacitor 212A and the sampling capacitor 212B. As a result of this arrangement, the sampling capacitors 212A and 212B may always hold consecutive samples of the input signal.

When the sensor system 100 is in the testing mode 174, the test signal 123 is injected into the signal path 140, and the condition of the signal path 140 is assessed by the diagnostic circuit 130. More particularly, when the sensor system 100 is in the testing mode 174, switch 111 is turned off, switch 127 is turned on, switch 208 is turned on, switch 202 is turned off, switch 204 is turned off, switch 218A is turned on, switch 214A is turned off, switch 216A is turned off, switch 218B is turned on, switch 214B is turned off, and switch 216B is turned off.

In some respects, when the sensor system 100 is in the testing mode 174, the bypass line 209 may be closed and the capacitor 206 may be disconnected from the rest of the signal path 140. This causes the state of the capacitor 206 to be preserved while the sensor system 100 is in the testing mode 174, allowing the operation of the sensor system 100 to be resumed without having to reset the low-pass filter 146 when the sensor system 100 returns to the operating mode 172.

Furthermore, when the sensor system 100 is in the testing mode 174, the bypass lines 219A and 219B may be closed, and sampling capacitors 212A and 212B may be disconnected from the rest of the signal path 140. This causes the state of the sampling capacitors 212A and 212B to remain unaffected by the injection of the test signal 123 into the signal path 140, which in turn allows the sinc filter 148 to resume operating immediately when the sensor system 100 transitions back into the operating mode 172. If the sampling capacitors 212A and 212B are not disconnected, the sensor system 100 would have to wait for a respective sample to be stored in each of the sampling capacitors 212A and 212B (i.e., wait out two consecutive phases of the signal 121) before the sensor system 100 could resume generating accurate output.

The operation of the signal path 140, when the sensor system 100 is in the operating mode 172, is now described in further detail. When the sensor system 100 is in the operating mode 172, the frontend amplifier 142 may amplify the signal 121 to produce a signal 143. The demodulator 144 may demodulate the signal 143, based on the signal 117, to produce a signal 147. The low-pass filter 146 may filter the signal 147 to produce a signal 149. The first portion 148A of the sinc filter 148 may sample the signal 149 into the sampling capacitor 212A. The second portion 148B of the sinc filter 148 may sample the signal 149 into the sampling capacitor 212B. The addition unit 220 may generate a signal 221 that is equal to the sum of signals (or samples) 217A and 217B, which are provided by the sampling capacitors 212A and 212B, respectively. The division unit 222 may generate a signal 223 by dividing the signal 221 by half. The Schmitt trigger circuit 228 may receive the signal 223 as input and output a signal 229. The value of the signal 229 may be stored in the latch 230, and subsequently output from the latch 230 as the signal 129. The value of the signal 129 may be used by the signal processor 160 to generate the output signal 133, but it may not be used by the diagnostic circuit 130 to generate the status signal 131. In some implementations, the sensor system 100 may transition from the operating mode 172 to the testing mode 174 when the value of a signal 407 (shown in FIGS. 4 and 5) rises to logic-high, and the sensor system 100 may return from the testing mode 174 to the operating mode 172 when the value of signal 407 drops back to logic-low.

The operation of the signal path 140, when the sensor system 100 is in the testing mode 174, is now described in further detail. When the sensor system 100 is in the testing mode 174, the frontend amplifier 142 may amplify the test signal 123 to produce the signal 143. The demodulator 144 may demodulate the signal 143, based on the signal 117, to produce the signal 147. In some implementations, demodulating the signal 143 may include multiplying the signal 143 by the signal 147. The signal 143 may have an AC component and a DC component. As is well-known in the art, the AC component of the signal 143 may represent the magnetic flux density of one or more magnetic fields that are incident on the sensing system 100, and the DC component of the signal 143 may represent the offset of the sensing module 110. The AC component of the signal 147 may have a phase 402 and a phase 403. The timing of phases 402 and 403 is discussed further below with respect to FIG. 4. Although in the example of FIG. 2 the signal 147 includes two phases, alternative implementations are possible in which the signal 147 includes any number of phases.

The signal 147 may bypass the low-pass filter 146 and the sinc filter 148 (as a result switches 208, 218A, and 218B being turned on). The addition unit 220 may add the signal 174 to itself to produce the signal 221 and the division unit 222 may divide the signal 221 by half to produce the signal 223. As can be readily appreciated, the signal 223 may be equal to the signal 147 (when the sensor system 100 is in the testing mode 174). The Schmitt trigger circuit 228 may receive the signal 223 as input and output the signal 229. The value of the signal 229 may be stored in the latch 230, and subsequently output from the latch 230 as the signal 129. The latch 230 may be set by a signal 231, such that the value of the signal 229 is stored in the latch 230 when the signal 231 is set to logic-high. The value of the signal 129 may be used by the diagnostic circuit 130 to generate the status signal 131, but it may not be used by the signal processor 160 to generate the output signal 133.

Figure 4:
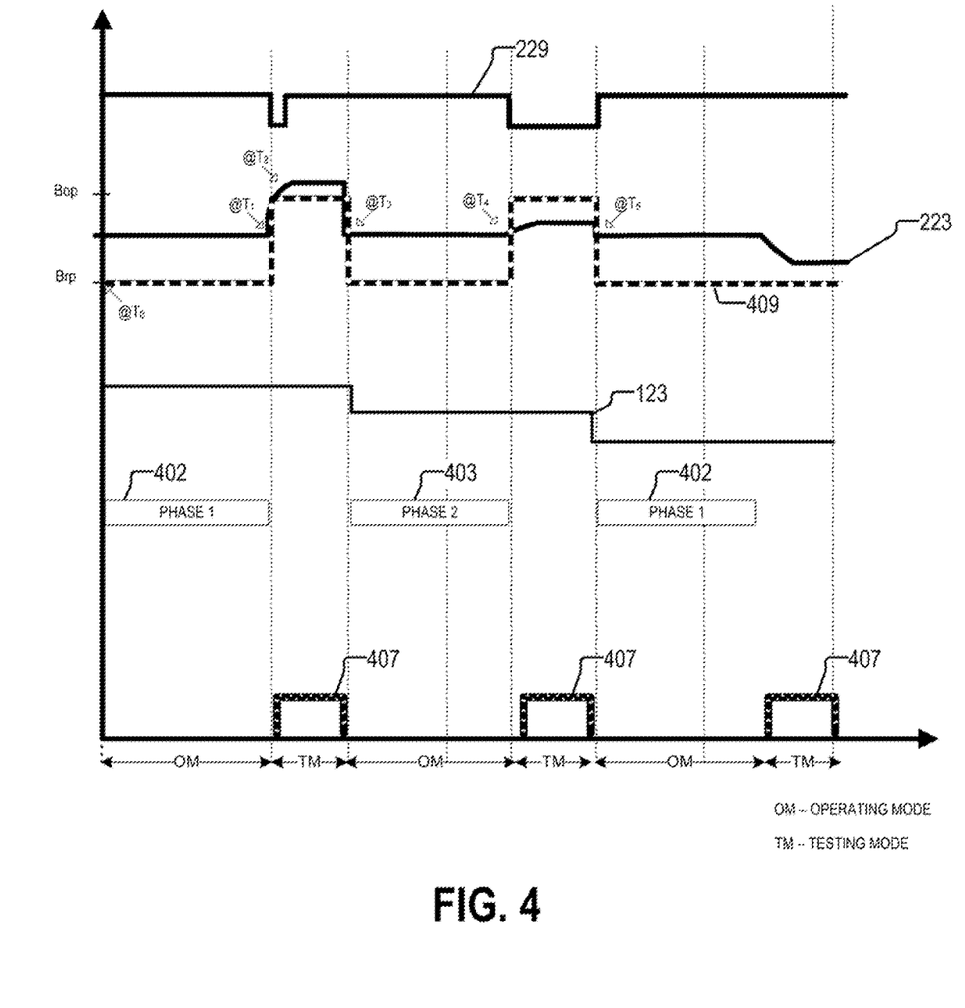
FIG. 4 is a waveform diagram illustrating the operation of the sensor system of FIG. 1A, according to aspects of the disclosure.

FIG. 4 depicts an example of the operation of the sensor system 100, according to aspects of the disclosure. According to the example of FIG. 4, switches 127, 208, 218A, and 218B may be controlled by the signal 407. When the value of signal 407 is logic-high, switches 127, 208, 218A, and 218B may be turned on. When the value of signal 407 is logic-low, switches 127, 208, 218A, and 218B may be turned off. As noted above, when the sensor system 100 is in the testing mode 174, the signal 407 may be set to logic-high and when the sensor system 100 is in the operating mode 172, the signal 407 may be set to logic-low. Furthermore, switches 202, 204, 214A, 214B, 216A, and 216B may be turned off when the signal 407 is set to logic high.

When the test signal 123 is injected into the signal path 140: (i) the low-pass filter 146 is bypassed as a result of turning on switch 208, (ii) the capacitor 206 is disconnected from the signal path 140 as a result of turning off switches 202 and 204, (iii) the sampling capacitor 212A is bypassed as a result of turning on switch 218A, (iv) the sampling capacitor 212A is disconnected from the signal path 140 as a result of turning off switches 214A and 216A, (v) the sampling capacitor 212B is bypassed as a result of turning on switch 218B, and (vi) the sampling capacitor 212B is disconnected from the signal path 140 as a result of turning off switches 214B and 216B. As noted above, disconnecting the sampling capacitors helps preserve the state of the sampling capacitors 212A and 212B while the test signal is injected into the signal path 140. Preserving the state of the sampling capacitors is advantageous because it reduces the time it takes the sensor system 100 to resume operating after the injection of the test signal 123. If the sampling capacitors 212A and 212B were not disconnected from the signal path 140, the processing circuitry would have to wait for at least two phases of the signal 121, to allow the sampling capacitors 212A and 212B to charge, before resuming output of the signal 133.

FIG. 4 further shows a plot of the threshold 409 of the Schmitt trigger circuit 228, the signal 223, which is input into the Schmitt trigger circuit 228, and the signal 229 that is output from the Schmitt trigger circuit 228. At time $T_0$, the threshold 409 is equal to the value Brp and the value of the signal 223 is greater than the value Brp. In response, the signal 229 is set to logic-high by the Schmitt trigger circuit 228. At time $T_1$, the threshold 409 rises to a value Bop, and it briefly surpasses the value of the signal 223. In response, the value of the signal 229 is set to logic-low by the Schmitt trigger circuit 228. At time $T_2$, the signal 223 rises above the threshold 409, and it becomes greater than the value Bop of the threshold 409. In response, the value of the signal 229 is set to logic-high again. At time $T_3$, the value of threshold 409 returns to Brp, and the value of the signal 223 decreases, while remaining above the value Brp. Because the value of the signal 223 remains above that of the threshold 409, the value of the signal 229 remains at logic-high. At time $T_4$, the value of the threshold 409 rises to Bop and the value of the signal 223 rises, while remaining below the value of threshold 409. In response, the value of the signal 229 is set to logic-low by the Schmitt trigger circuit 228. At time $T_5$, the value of the threshold 409 returns to Brp and the value of the signal 223 falls, while remaining above that of the threshold 409. Because the value of the signal 223 remains above that of threshold 409, the value of the signal 229 is set to logic-high by the Schmitt trigger circuit 228.

FIG. 4 illustrates, that the signal 407 is set to a logic-high value when the sensing system 100 is in the testing mode 174. In addition, FIG. 4 illustrates that the signal 407 is set to a logic-low value when the sensing system 100 is in the testing mode 172. Moreover, FIG. 4 illustrates that the test signal is injected into the signal path 140 between each phase of the signal 147. As noted above, the signal 147 is generated based on the signal 111 (which is output from the sensing module 110) when the sensor system 100 is in the operating mode 172. In some implementations, the signal 117 may be set to '1' when the sensing system 100 is in the testing mode 172. In this regard, it will be understood that setting the signal 117 to '1' during the testing mode 174 prevents the demodulator 144 from modifying the signal 123 (and/or other signals that are generated based on it), thus simplifying the operation of the diagnostic circuit 130. However, it will be understood that the present disclosure is not limited to the signal 117 having any specific value during the testing mode 174.

Figure 5:
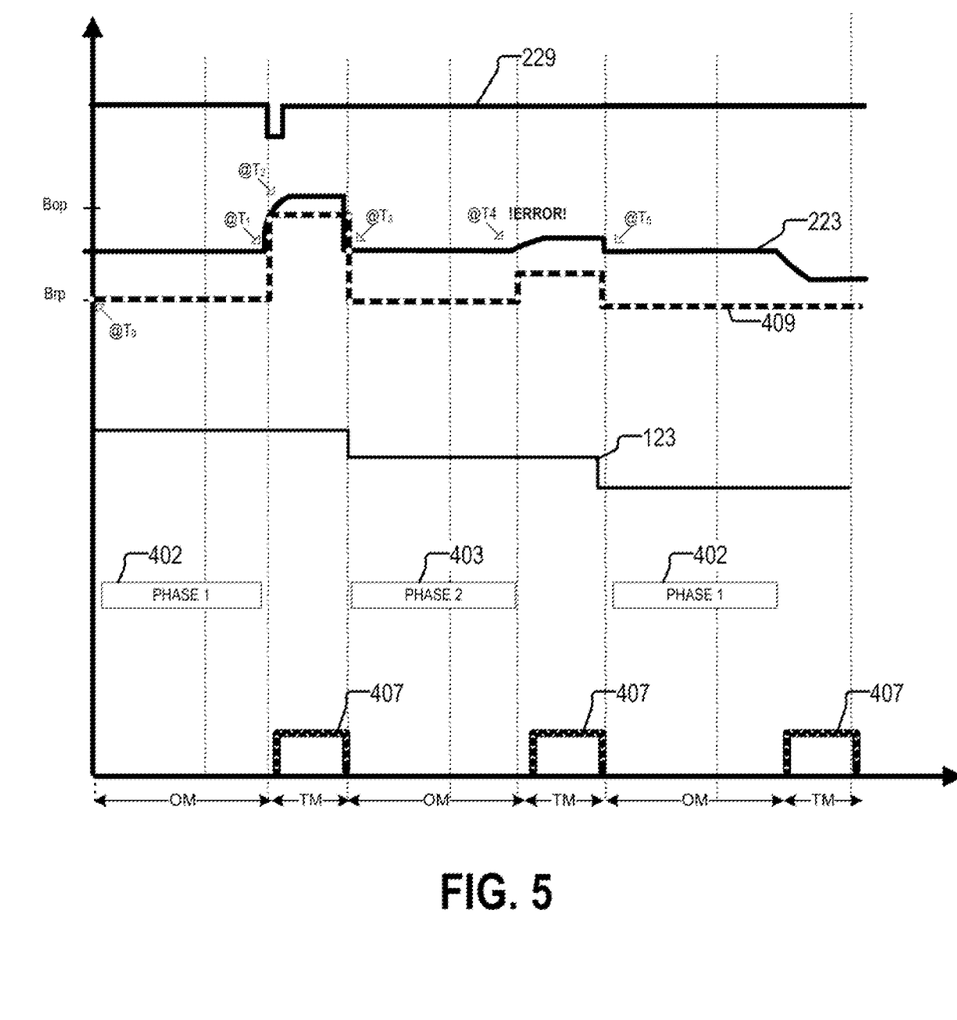
FIG. 5 is a waveform diagram illustrating the operation of the sensor system of FIG. 1A, according to aspects of the disclosure.

FIG. 5 is a signal diagram illustrating the operation of the sensor system 100 when the Schmitt trigger circuit fails at time $T_4$. As a result of the failure, the threshold 409 does not return to the value of the signal Bop, thus allowing the signal 223 to remain above the threshold 409. Because the signal 223 remains above the threshold 409, the value of the signal 229 remains at logic-high, even though it should have been set to logic-low, if the Schmitt trigger circuit 228 were operating correctly.

FIG. 4 is provided to illustrate the operation of the sensor system 100 when no failures are present in the sensor system 100. FIG. 5 is provided to illustrate the operation of the sensor system 100 when the Schmitt trigger circuit 228 fails under circumstances identical to those in the example of FIG. 4. When the test signal 123 is injected into the signal path 140, the value of the threshold 409 may change. The value of the signal 229 can be predicted based on the value of the test signal 123 and the response function of the Schmitt trigger circuit 228. Any discrepancies between the predicted and actual values of the signal 229 would signal a failure in the Schmitt trigger circuit 228. As is discussed further below with respect to FIG. 6, such discrepancies may be recognized and acted upon by the diagnostic circuit 130.

According to the example of FIGS. 4-5, signals 231 and 407 are generated by the signal processor 160. However, alternative implementations are possible in which any of the signals 231 and 407 is generated by the diagnostic circuit 130 and/or any other processing circuitry that is part of the sensor system 100. Although in the example of FIGS. 1A-4, the signal processor 160 and the diagnostic circuit 130 are depicted as separate blocks, it will be understood that in some implementations, the signal processor 160 and the diagnostic circuit 130 may be integrated into the same processing circuitry. Stated succinctly, the present disclosure is not limited to any specific implementation of the signal processor 160 and the diagnostic circuit 130.

Figure 6:
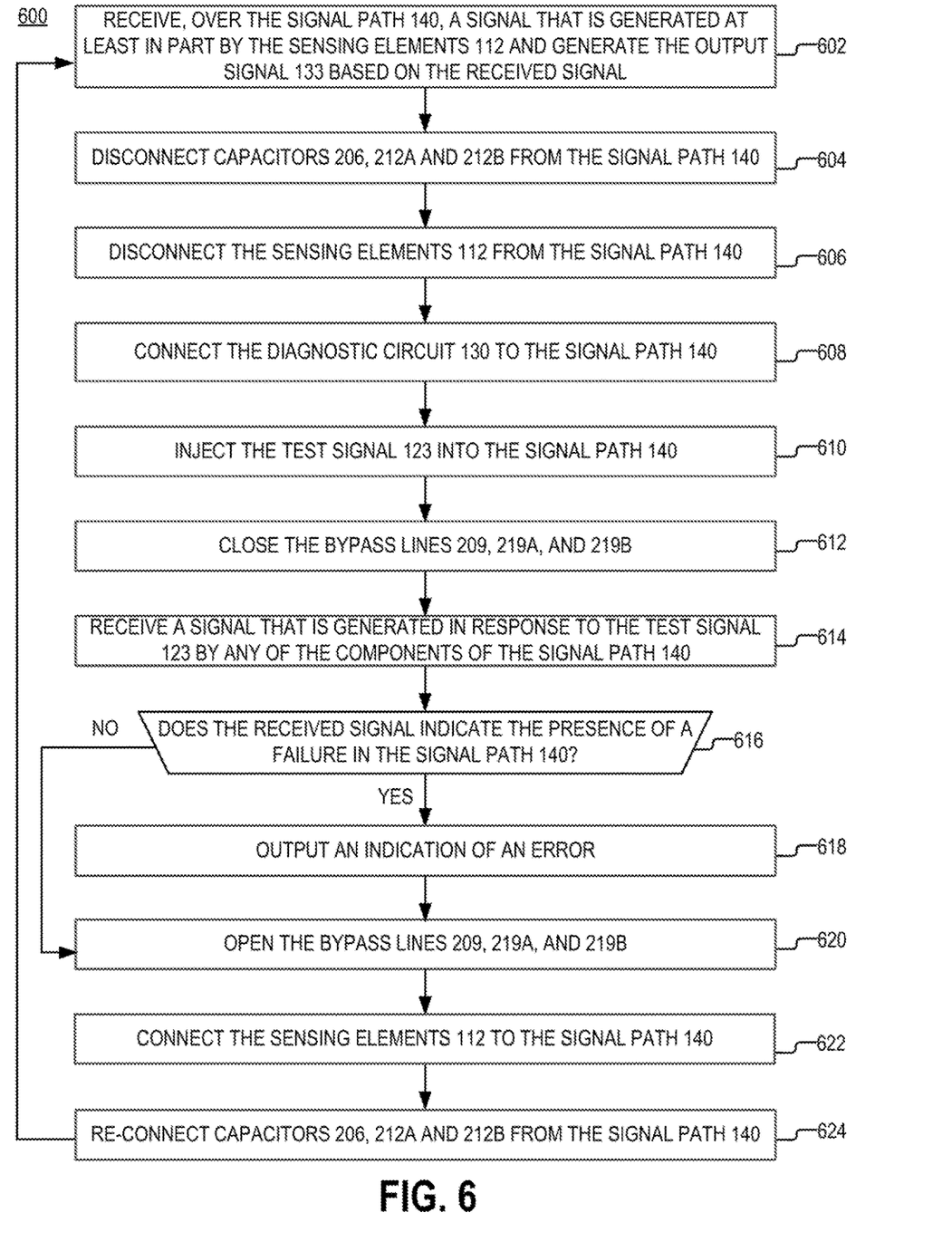
FIG. 6 is a flowchart of an example of a process, according to aspects of the disclosure.

FIG. 6 is a flowchart of an example of a process 600, according to aspects of the disclosure.

At step 602, the signal processor 160 receives a signal that that is generated at least in part by the sensing elements 112 and generates the output signal 133 based on the received signal. According to the present example, step 602 is executed when the sensor system 100 is in the operating mode 172, and the received signal includes the signal 129.

At step 604, the signal processor 160 disconnects the capacitor 206 (which is part of the low-pass filter 146) and the sampling capacitors 212A and 212B from the signal path 140. The capacitor 206 is disconnected by turning off switches 202 and 204. The sampling capacitor 212A is disconnected by turning off switches 214A and 216A. The sampling capacitor 212B is disconnected by turning off switches 214B and 216B.

At step 606, the signal processor 160 disconnects the sensing module 110 from the signal path 140 by turning off the switch 111. At step 608, the signal processor 160 connects the diagnostic circuit 130 to the signal path 140 by turning on the switch 127. At step 610, the diagnostic circuit 130 injects the test signal 123 into the signal path 140. At step 612, the signal processor 160 closes bypass lines 209, 219A, and 219B by turning on switches 208, 218A, and 218B respectively. According to the present example, by executing steps 604-610, the signal processor 160 transitions the sensor system 100 from the operating mode 172 to the test mode 174.

At step 614, the diagnostic circuit 130 receives the signal 129, which is generated by the Schmitt trigger circuit 228 in response to the test signal 123. According to the present example, step 612 is executed while the sensor system 100 is in the test mode 174.

At step 616, the diagnostic circuit 130 detects whether the received signal is indicative of a failure in the signal path 140. Specifically, the diagnostic circuit 130 may compare the value of the received signal to an expected value for the signal. If the actual value is different from the expected value (e.g., by a predetermined amount), the diagnostic circuit 130 may determine that there is a failure in the signal path 140. For example, the diagnostic circuit 130 may determine that the Schmitt trigger circuit 228 has failed. If the diagnostic circuit 130 determines that there is a failure in the signal path 140, the process 600 proceeds to step 618. Otherwise, if no failure is detected in the signal path 140, the process 600 proceeds to step 620.

At step 618, the diagnostic circuit 130 outputs an indication of an error. Outputting the indication of an error may include setting the status signal 131 (shown in FIG. 1A) to a value that indicates the presence of an error.

At step 620, the signal processor 160 opens the bypass lines 209, 219A, and 219B by turning off switches 208, 218A, and 2198B, respectively. At step 622, the signal processor 160 connects the sensing module 110 to the signal path 140 by turning on the switch 111. Connecting the sensing module 110 to the signal path prevents an open circuit from being created. At step 624, the signal processor re-connects the capacitor 206 (which is part of the low-pass filter 146), and one of the sampling capacitors 212A and 212B, to the rest of the components of the signal path 140. The capacitor 206 is re-connected to the signal path 140 by turning on switches 202 and 204. The sampling capacitor 212A may be re-connected to the signal path 140 by turning on switches 214A and 216A. The sampling capacitor 212B may be re-connected to the signal path 140 by turning on switches 214B and 216B. According to the present example, by executing steps 620-622, the signal processor 160 transitions the sensor system 100 from the test mode 174 to the operating mode 172. After steps 622 and 624 are executed, the process 600 returns to step 602.

Although in the example of FIG. 6, the signal 129 is received at step 614, alternative implementations are possible in which the received signal includes any of the: signal 143 (generated by frontend amplifier 142), signal 147 (generated by demodulator 144), signal 149 (generated by low-pass filter 146), signal 223 (generated by sinc filter 148), signal 229 (generated by Schmitt trigger circuit 228), and or any other signal that is generated by one or more components of the signal path 140. Although in the example of FIG. 6, at step 616, the diagnostic circuit 130 determines whether the Schmitt trigger circuit 228 is operating correctly, alternative implementations are possible in which the diagnostic circuit 228 may determine whether another component of the signal path 140 is operating correctly. For instance, if the diagnostic circuit 130 receives the signal 143 (at step 614), the diagnostic circuit 130 may determine whether the frontend amplifier 142 is operating correctly. As yet another example, if the diagnostic circuit 130 receives the signal 223 (at step 614), the diagnostic circuit 130 may determine whether one or more parts of the sinc filter 148 are operating correctly (even though it is not possible to check the sampling capacitors). Although in the example of FIGS.

1A-6, the status signal 131 and the output signal 133 are depicted as being output over separate lines/pins, it will be understood that alternative implementations are possible in which the signals 131 and 133 are time-multiplexed or otherwise encoded on the same line/pin. Although in the example of FIGS. 1A-6, the status signal 131 identifies whether a failure is present or not, alternative implementations are possible in which the status signal 131 also includes a code that identifies the component of the signal path 140 that has failed. Stated succinctly, the present disclosure is not limited to any specific method for outputting an indication of an error.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A method for testing a signal path in a sensor, the signal path including a filter circuit and a comparator circuit, the method comprising:
closing a first signal line that is arranged to bypass a first capacitor in the filter circuit, the first signal line having a first end and a second end, the first end being coupled to a first node in the signal path that is located downstream from the first capacitor, and the second end being coupled to a second node in the signal path that is located upstream from the first capacitor;
injecting a test signal into the signal path after the first signal line is closed; and
detecting whether a signal that is output by the comparator circuit in response to the test signal satisfies a predetermined condition.

2. The method of claim 1, wherein the signal path is arranged to couple one or more sensing elements with a signal processor, the method further comprising disconnecting the one or more sensing elements from the signal path before the test signal is injected.

3. The method of claim 1, further comprising, concurrently with closing the first signal line, turning off a first switch that is arranged to decouple the first capacitor from a downstream portion of the signal path, and turning off a second switch that is arranged to decouple the first capacitor from an upstream portion of the signal path, wherein the turning off of both the first switch and the second switch causes a charge of the first capacitor to be preserved while the signal path is being tested, the charge being imparted on the first capacitor, at least in part, by one or more sensing elements.

4. The method of claim 1, further comprising outputting an indication of an error when the predetermined condition is not satisfied.

5. The method of claim 1, further comprising closing a second signal line that is arranged to bypass a second capacitor in the filter circuit, the second signal line being closed before the test signal is injected into the signal path, wherein the filter circuit includes a low-pass filter and a sinc filter, the first capacitor is part of the low-pass filter, and the second capacitor is part of the sinc filter.

6. The method of claim 1, wherein the comparator circuit includes a Schmitt trigger circuit, and detecting whether the signal that is output from the comparator circuit satisfies the predetermined condition includes detecting whether the signal that is output from the Schmitt trigger circuit corresponds to a current trigger threshold of the Schmitt trigger circuit.

7. The method of claim 1, wherein:
the signal path includes an amplifier;
the filter circuit is interposed between the amplifier and the comparator circuit; and injecting the test signal into the signal path includes applying the test signal at an input of the amplifier.

8. The method of claim 1, wherein:
the signal path is coupled to a modulator that is configured to modulate a signal received from the one or more sensing elements and provide the modulated signal to the signal path;
the modulator is configured to generate a respective first pulse during each of a plurality of first periods in an operation of the modulator and a respective second pulse during each of a plurality of second periods in the operation of the modulator; and
the test signal is injected into the signal path at an end of any of the first periods and/or at an end of any of the second periods.

9. A system, comprising:
a signal processor;
one or more sensing elements;
a signal path that is arranged to couple the one or more sensing elements to the signal processor, the signal path including a comparator circuit and a filter circuit, the filter circuit including a first capacitor; and
a diagnostic circuit configured to: close a first signal line that is arranged to bypass the first capacitor in the filter circuit, inject a test signal in the signal path after the first signal line is closed, and detect whether a signal that is output by the comparator circuit in response to the test signal satisfies a predetermined condition,
wherein the first signal line has a first end and a second end, the first end being coupled to a first node in the signal path that is located downstream from the first capacitor, and the second end being coupled to a second node in the signal path that is located upstream from the first capacitor.

10. The system of claim 9, wherein the diagnostic circuit is further configured to disconnect the one or more sensing elements from the signal path before the test signal is injected.

11. The system of claim 9, wherein:
the diagnostic circuit is further configured to, concurrently with closing the first signal line, turn off a first switch that is arranged to decouple the first capacitor from a downstream portion of the signal path, and turns off a second switch that is arranged to decouple the first capacitor from an upstream portion of the signal path, and
the turning off of both the first switch and the second switch causes a charge of the first capacitor to be preserved while the signal path is being tested, the charge being imparted on the first capacitor, at least in part, by the one or more sensing elements.

12. The system of claim 9, wherein the diagnostic circuit is further configured to output an indication of an error when the predetermined condition is not satisfied.

13. The system of claim 9, wherein the filter circuit further includes a second capacitor, and the diagnostic circuit is further configured to close a second signal line that is arranged to bypass the second capacitor before the test signal is injected into the signal path, wherein the filter circuit includes a low-pass filter and a sinc filter, the first capacitor is part of the low-pass filter, and the second capacitor is part of the sinc filter.

14. The system of claim 9, wherein the comparator circuit includes a Schmitt trigger circuit, and detecting whether the signal that is output from the comparator circuit satisfies the predetermined condition includes detecting whether the signal that is output from the Schmitt trigger circuit corresponds to a current trigger threshold of the Schmitt trigger circuit.

15. The system of claim 10, wherein the signal path includes an amplifier;
the filter circuit is interposed between the amplifier and the comparator circuit; and
injecting the test signal into the signal path includes applying the test signal at an input of the amplifier.

16. The system of claim 10, wherein:
the one or more sensing elements are coupled to the signal path via a modulator;
the modulator is configured to modulate a signal received from the one or more sensing elements and provide the modulated signal to the signal path, the modulating of the received signal including generating a respective first pulse during each of a plurality of first periods in an operation of the modulator and a respective second pulse during each of a plurality of second periods in the operation of the modulator; and
the test signal is injected into the signal path at an end of any of the first periods and/or at an end of any of the second periods.

17. The system of claim 10, wherein the one or more sensing elements include a magnetic field sensing element.

18. A system, comprising:
a signal processor;
one or more sensing elements;
a signal path that is arranged to couple the one or more sensing elements to the signal processor, the signal path including a comparator circuit and a filter circuit, the filter circuit including a capacitor; and
a diagnostic circuit configured to: close a first signal line that is arranged to bypass the capacitor in the filter circuit, inject a test signal in the signal path after the first signal line is closed, and detect whether a signal that is output by any component of the signal path, in response to the test signal, satisfies a respective predetermined condition,
wherein the first signal line has a first end and a second end, the first end being coupled to a first node in the signal path that is located downstream from the capacitor, and the second end being coupled to a second nod in the signal path that is located upstream from the capacitor.

19. The system of claim 18, wherein detecting whether a signal that is output by any component of the signal path satisfies a predetermined condition includes one of: (i) detecting whether a signal that is output by the filter circuit in response to the test signal satisfies the respective predetermined condition, or (ii) detecting whether a signal that is output by the comparator circuit in response to the test signal satisfies the respective predetermined condition.

20. The system of claim 18, wherein:
the diagnostic circuit is further configured to, concurrently with closing the first signal line, turn off a first switch that is arranged to decouple the capacitor from a downstream portion of the signal path, and turn off a second switch that is arranged to decouple the capacitor from an upstream portion of the signal path, and
the turning off of both the first switch and the second switch causes a charge of the capacitor to be preserved while the signal path is being tested, the charge being imparted on the capacitor, at least in part, by the one or more sensing elements.

\* \* \* \* \*

UNITED STATES PATENT AND TRADEMARK OFFICE
CERTIFICATE OF CORRECTION

PATENT NO. : 11,561,257 B2
APPLICATION NO. : 17/130161
DATED : January 24, 2023
INVENTOR(S) : Ezequiel Rubinsztain et al.

It is certified that error appears in the above-identified patent and that said Letters Patent is hereby corrected as shown below:

In the Specification

Column 3, Line 7 delete "sine" and replace with --sinc--.

Column 3, Line 11 delete "FIG. 1," and replace with --FIG. 1A,--.

Column 3, Line 16 delete "sine" and replace with --sinc--.

Column 3, Line 67 delete "164".

Column 5, Lines 27-28 delete "may be include" and replace with --may include--.

Column 5, Line 35 delete "DAC 720." and replace with --DAC 710.--.

Column 5, Line 60 delete "Bop)" and replace with --Bop).--.

Column 7, Line 44 delete "174" and replace with --147--.

Column 8, Line 62 delete "signal 111" and replace with --signal 121--.

Column 8, Line 66 delete "testing mode 172." and replace with --testing mode 174.--.

Column 9, Line 33 delete "407 is" and replace with --407 are--.

Column 9, Lines 45-46 delete "that that" and replace with --that--.

Column 10, Lines 52 delete ", and or" and replace with --and/or--.

Signed and Sealed this
Twenty-sixth Day of March, 2024

*Katherine Kelly Vidal*

Katherine Kelly Vidal
*Director of the United States Patent and Trademark Office*

Column 10, Line 58 delete "228" and replace with --130--.

Column 13, Line 43 delete "turns" and replace with --turn--.